(12) United States Patent
Naser et al.

(10) Patent No.: US 11,205,620 B2
(45) Date of Patent: Dec. 21, 2021

(54) METHOD AND APPARATUS FOR SUPPLYING POWER TO VLSI SILICON CHIPS

(71) Applicant: International Business Machines Corporation, Armonk, NY (US)

(72) Inventors: Hassan Naser, Austin, TX (US); Daniel Stasiak, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 314 days.

(21) Appl. No.: 16/134,269

(22) Filed: Sep. 18, 2018

(65) Prior Publication Data

US 2020/0091072 A1    Mar. 19, 2020

(51) Int. Cl.
*H01L 23/48* (2006.01)
*H01L 23/528* (2006.01)
*H01L 23/535* (2006.01)
*H01L 23/522* (2006.01)
*H01L 23/367* (2006.01)
(Continued)

(52) U.S. Cl.
CPC .......... *H01L 23/535* (2013.01); *H01L 23/367* (2013.01); *H01L 23/481* (2013.01); *H01L 23/5226* (2013.01); *H01L 23/5286* (2013.01); *H01L 24/73* (2013.01); *H01L 23/3677* (2013.01); *H01L 23/49582* (2013.01); *H01L 2224/73257* (2013.01)

(58) Field of Classification Search
CPC . H01L 25/0655; H01L 24/73; H01L 23/3128; H01L 23/3677; H01L 23/481; H01L 23/49534; H01L 23/49582; H01L 23/498–49894; H01L 23/5226; H01L 23/5286; H01L 23/535; H01L 23/5383–5385; H01L 2224/16155–16168; H01L 2224/16225–1624; H01L 2224/16245–1626; H01L 2224/24155; H01L 2224/24225–24227; H01L 2224/32155–32168; H01L 2224/32225–3224; H01L 2224/32245–3226
See application file for complete search history.

(56) References Cited

U.S. PATENT DOCUMENTS 5,587,882 A * 12/1996 Patel ................... H01L 23/3675
257/713
5,644,163 A * 7/1997 Tsuji ..................... H01L 23/367
257/706
(Continued)

*Primary Examiner* — Maliheh Malek
(74) *Attorney, Agent, or Firm* — Scully, Scott, Murphy & Presser, P.C.

(57) ABSTRACT

An integrated circuit module, system and method of providing power and signals is disclosed that includes a silicon chip and a package substrate having voltage connections and signal connections. The silicon chip includes a silicon substrate having a top surface, a bottom surface and circuitry formed therein, one or more front-side metal layers formed on the top surface of the silicon substrate, one or more back-side metal layers formed on the bottom surface of the silicon substrate, and one or more through silicon vias (TSVs) formed through the silicon substrate for creating a conductive pathway from the back-side of the silicon substrate to the front-side of the silicon substrate, preferably closest to the silicon substrate.

10 Claims, 6 Drawing Sheets

(51) Int. Cl.
*H01L 23/00* (2006.01)
*H01L 23/495* (2006.01)

(56) References Cited

U.S. PATENT DOCUMENTS

| | | | | |
|---|---|---|---|---|
| 5,914,533 | A * | 6/1999 | Frech | H01L 23/5385 257/700 |
| 6,282,095 | B1 * | 8/2001 | Houghton | H01L 23/3675 165/80.2 |
| 6,351,391 | B1 * | 2/2002 | Beliveau | H01L 23/647 174/255 |
| 8,198,716 | B2 | 6/2012 | Periaman et al. | |
| 8,212,343 | B2 | 7/2012 | Chen | |
| 8,264,067 | B2 | 9/2012 | Law et al. | |
| 8,373,230 | B1 * | 2/2013 | Or-Bach | H01L 29/792 257/347 |
| 8,802,454 | B1 * | 8/2014 | Rahman | H01L 22/34 438/17 |
| 8,803,305 | B2 | 8/2014 | Radojcic et al. | |
| 9,059,127 | B1 * | 6/2015 | Lamorey | H01L 23/3672 |
| 9,331,062 | B1 | 5/2016 | Lane et al. | |
| 9,406,561 | B2 * | 8/2016 | Farooq | H01L 25/50 |
| 9,640,531 | B1 * | 5/2017 | Or-Bach | H01L 21/76816 |
| 2002/0066591 | A1 * | 6/2002 | Li | H01L 23/49822 174/255 |
| 2002/0113244 | A1 * | 8/2002 | Barnett | F21V 29/70 257/98 |
| 2008/0237310 | A1 | 10/2008 | Periaman et al. | |
| 2009/0251862 | A1 * | 10/2009 | Knickerbocker | H01L 25/0652 361/699 |
| 2010/0127394 | A1 * | 5/2010 | Ramiah | H01L 23/522 257/751 |
| 2010/0140779 | A1 * | 6/2010 | Lin | H01L 23/5389 257/690 |
| 2010/0246152 | A1 * | 9/2010 | Lin | H01L 24/92 361/783 |
| 2010/0314711 | A1 * | 12/2010 | Farooq | H01L 21/76898 257/506 |
| 2011/0012244 | A1 | 1/2011 | Chen | |
| 2011/0042795 | A1 * | 2/2011 | Knickerbocker | H01L 23/481 257/686 |
| 2011/0115064 | A1 | 5/2011 | Radojcic et al. | |
| 2011/0121811 | A1 * | 5/2011 | Dennard | H01L 25/0657 323/318 |
| 2011/0170266 | A1 * | 7/2011 | Haensch | H01L 24/92 361/722 |
| 2011/0215457 | A1 | 9/2011 | Park | |
| 2012/0146711 | A1 * | 6/2012 | Bartley | H01L 21/823431 327/530 |
| 2012/0193752 | A1 * | 8/2012 | Purushothaman | H01L 29/0649 257/506 |
| 2013/0049213 | A1 * | 2/2013 | Scheuermann | H01L 23/522 257/774 |
| 2013/0082365 | A1 * | 4/2013 | Bernier | H01L 23/49833 257/659 |
| 2015/0054149 | A1 * | 2/2015 | Purushothaman | H01L 21/76897 257/737 |
| 2015/0108604 | A1 * | 4/2015 | Nakamura | H01L 23/49833 257/532 |
| 2015/0192633 | A1 * | 7/2015 | Garibay | G01R 1/06738 324/755.01 |
| 2015/0206838 | A1 * | 7/2015 | Brunschwiler | H01L 23/49822 257/531 |
| 2015/0243609 | A1 * | 8/2015 | Lamorey | H01L 25/165 361/717 |
| 2015/0285998 | A1 * | 10/2015 | Babakhani | H01L 31/02327 438/27 |
| 2015/0348954 | A1 * | 12/2015 | Chandolu | H01L 24/17 257/712 |
| 2015/0349526 | A1 * | 12/2015 | Duby | H02J 1/00 307/11 |
| 2015/0371971 | A1 | 12/2015 | Yokoyama et al. | |
| 2016/0211191 | A1 * | 7/2016 | Tan | H01L 23/40 |
| 2016/0293497 | A1 * | 10/2016 | Eckert | H01L 22/20 |
| 2016/0334991 | A1 * | 11/2016 | Berger | G06F 3/0673 |
| 2017/0047312 | A1 * | 2/2017 | Budd | H01L 25/117 |
| 2017/0084596 | A1 * | 3/2017 | Scanlan | H01L 25/50 |
| 2017/0200716 | A1 * | 7/2017 | Or-Bach | H01L 27/092 |
| 2017/0207214 | A1 * | 7/2017 | Or-Bach | H01L 27/0694 |
| 2017/0263518 | A1 * | 9/2017 | Yu | H01L 25/00 |
| 2017/0365581 | A1 * | 12/2017 | Yu | H01L 23/49811 |
| 2018/0102470 | A1 * | 4/2018 | Das | H01L 23/5384 |
| 2018/0176006 | A1 * | 6/2018 | McElheny | H01L 25/0657 |
| 2018/0331028 | A1 * | 11/2018 | Cox | H01L 21/4853 |
| 2018/0351507 | A1 * | 12/2018 | Doris | H03B 5/08 |
| 2019/0006192 | A1 * | 1/2019 | Or-Bach | H01L 23/5226 |
| 2019/0006222 | A1 * | 1/2019 | Or-Bach | H01L 21/6835 |
| 2019/0013213 | A1 * | 1/2019 | Or-Bach | H01L 27/098 |
| 2019/0019693 | A1 * | 1/2019 | Or-Bach | H01L 21/823487 |
| 2019/0238134 | A1 * | 8/2019 | Lee | H01L 29/7883 |
| 2019/0245543 | A1 * | 8/2019 | Lee | G11C 11/412 |
| 2019/0295952 | A1 * | 9/2019 | Sikka | H01L 23/5385 |
| 2020/0066679 | A1 * | 2/2020 | Bohr | H01L 23/5226 |
| 2020/0098849 | A1 * | 3/2020 | Naser | H01L 23/5226 |
| 2020/0212018 | A1 * | 7/2020 | Lai | H01L 23/13 |
| 2020/0243487 | A1 * | 7/2020 | Or-Bach | H01L 25/50 |
| 2020/0286871 | A1 * | 9/2020 | Lift | H01L 24/81 |
| 2021/0020457 | A1 * | 1/2021 | Or-Bach | H01L 25/0657 |
| 2021/0043607 | A1 * | 2/2021 | Or-Bach | H01L 24/08 |

\* cited by examiner

METHOD AND APPARATUS FOR SUPPLYING POWER TO VLSI SILICON CHIPS

BACKGROUND

The present invention relates to integrated circuits, including Very Large Scale Integration (VLSI) silicon chip modules or packages, and methods and architectures for supplying power to integrated circuits including VLSI chip modules/packages.

With recent advancement of information technology and wide use of the Internet to store and process information, more and more demands are placed on the acquisition, processing, storage, and dissemination of information by information handling systems, e.g., computing systems. Information handling systems are being developed to increase the speed at which they are able to execute increasingly complex applications for business, personal use, and entertainment. Overall system performance is affected by each of the key elements of the information handling system, including the performance/structure of the integrated circuits or chips, processors, any memory devices or caches, input/output (I/O) subsystems, efficiency of the memory control functions, any associated memory interface elements, and the type and structure of the circuit interconnect interfaces.

The constantly increasing speed of information handling systems which execute increasingly complex applications places more rigorous performance demands on the multitude of integrated circuits or chips forming the circuitry in such systems. One manner to handle the increasing demands on such systems and circuitry has been the development of integrated circuits, and in particular Very Large Scale Integration (VLSI) silicon chip modules or packages. As VLSI increases silicon chip performance, the number of connections to the VLSI chip module has increased such that a significant amount of metal routing resources are used to provide various signal connections to the VLSI chip as well as to provide power to the VLSI chip. Newer VSLI integrated circuits and chips are limited by routing resources (routing of signals and power).

Computing demands require the ability to access an increasing number of higher density devices at faster and faster access speeds. The density of these VLSI chips and amount of power utilized by these VLSI chips typically generates a large amount of heat that may require the use of a heat sink. Extensive research and development efforts are invested by the industry to create improved and or innovative solutions to maximize overall chip performance by improving the design, structure, and/or the methods by which integrated circuits, including VLSI chips, and/or modules are made and operate. As device scaling continues to facilitate increases in the number of devices, e.g., transistors, per unit area on the silicon chip, the requirements for routing signals and power need to be addressed.

SUMMARY

The summary of the disclosure is given to aid understanding of integrated circuits, including VLSI silicon chips and/or modules and packages containing integrated circuits, their architectural structure, and their method of operation and fabrication, and not with an intent to limit the disclosure or the invention. The present disclosure is directed to a person of ordinary skill in the art. It should be understood that various aspects and features of the disclosure may advantageously be used separately in some instances, or in combination with other aspects and features of the disclosure in other instances. Accordingly, variations and modifications may be made to the integrated circuits, VLSI silicon chips, modules, packages, architectural structure, and/or method of operation and fabrication to achieve different effects.

In an embodiment, an integrated circuit module is disclosed that includes a silicon chip and a package substrate having voltage connections and signal connections. The silicon chip includes a silicon substrate having a top surface, a bottom surface and circuitry formed therein, one or more front-side metal layers formed on the top surface of the silicon substrate, one or more back-side metal layers formed on the bottom surface of the silicon substrate, and one or more through silicon vias (TSVs) formed through the silicon substrate for creating a conductive pathway from the back-side of the silicon substrate to the front-side of the silicon substrate. In an embodiment, the module is configured so that: a plurality of signal routing pathways are formed from the signal connections on the package substrate through a plurality of C4 connections to one or more of the front-side metal layers to the circuitry in the silicon substrate, and a plurality of voltage routing pathways are formed from the voltage connections on the package substrate to the one or more back-side metal layers to the one or more TSVs to one or more of the front-side metal layers to the circuitry in the silicon substrate.

In an aspect, the one or more TSVs are configured to extend through the silicon substrate to the front-side metal layer closest to the top surface of the silicon substrate, and preferably the voltage routing pathways extend to the front-side metal layer closest to the top surface of the silicon substrate. In an embodiment, the voltage routing pathways are configured and routed from the voltage connections on the package substrate through wire bonds to the one or more back-side metal layers. All voltage connections on the package substrate in an aspect are configured and routed from the package substrate to the back-side metal layers. In a further aspect, all the voltage connections on the package substrate are configured and routed from the package substrate through wire bonds to the one or more backside metal layers.

In another embodiment, a method of providing power and signals to an integrated circuit is disclosed where the method includes providing one or more signals to one or more front-side metal layers formed on a top surface of a silicon substrate, providing one or more voltages to one or more back-side metal layers formed on a bottom surface of a silicon substrate; and providing one or more voltages to the one or more front-side metal layers from the one or more backside metal layers through the silicon substrate. In an aspect, all the signals are provided to the one or more front side metal layers, preferably through C4 connections. In an embodiment, all the voltages are supplied to the one or more back-side metal layers. In an embodiment, the voltages are supplied from the backside metal layers to the front-side metal layer closest to the silicon substrate, preferably through the silicon substrate to the one or more front-side metal layers using one or more TSVs.

In a further embodiment, a method of forming an integrated circuit module is disclosed that includes forming circuitry in a silicon substrate, forming one or more front-side metal layers on a top surface of the silicon substrate including forming one or more front-side conductive signal pathways to route signals to the circuitry, forming one or more back-side metal layers on a bottom surface of the silicon substrate including forming one or more back-side conductive power pathways to route voltages to the backside of the silicon substrate, forming one or more front-side conductive power pathways in the one or more front-side metal layers to route power to the circuitry, and providing one or more through silicon vias (TSVs) to route the one or more backside conductive power pathways through the silicon substrate to the one or more front-side conductive power pathways. In a preferred embodiment, at least one of the TSVs extends from the backside metal layers though the silicon substrate to only the top-side metal layer closest to the silicon substrate.

BRIEF DESCRIPTION OF THE DRAWINGS

The various aspects, features, and embodiments of integrated circuits, VLSI silicon chips, VLSI chip module/packages, architectural structure, and their method of operation and fabrication will be better understood when read in conjunction with the figures provided. Embodiments are provided in the figures for the purpose of illustrating aspects, features, and/or various embodiments of the integrated circuit, VLSI chip, VLSI chip module/package, architectural structure, and method of operation and fabrication, but the claims should not be limited to the precise arrangement, structures, features, aspects, embodiments, methods, or devices shown, and the arrangements, structures, subassemblies, features, aspects, embodiments, methods, and devices shown may be used singularly or in combination with other arrangements, structures, subassemblies, features, aspects, embodiments, methods and/or devices.

DETAILED DESCRIPTION

The following description is made for illustrating the general principles of the invention and is not meant to limit the inventive concepts claimed herein. In the following detailed description, numerous details are set forth in order to provide an understanding of integrated circuits, VLSI chips, and modules (also referred to as packages), their architectural structure, and their method of operation and fabrication, however, it will be understood by those skilled in the art that different and numerous embodiments of the integrated circuit, VLSI chip, VLSI chip module/package, architectural structure, and method of operation and fabrication may be practiced without those specific details, and the claims and invention should not be limited to the embodiments, subassemblies, structures, features, processes, methods, aspects, or details specifically described and shown herein. Further, particular features described herein can be used in combination with other described features in various possible combinations and permutations.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an" and "the" include plural referents unless otherwise specified.

One area where integrated circuits, and particularly VLSI chips and/or modules, are used is in the many circuits and systems utilized in computing or data processing systems. The computing systems may take many forms and the VLSI chips or modules in an embodiment may include one or more processors, Random Access Memory (RAM) modules, nonvolatile memory, devices, device specific circuits, I/O interfaces, and I/O devices and peripherals.

Figure 1:
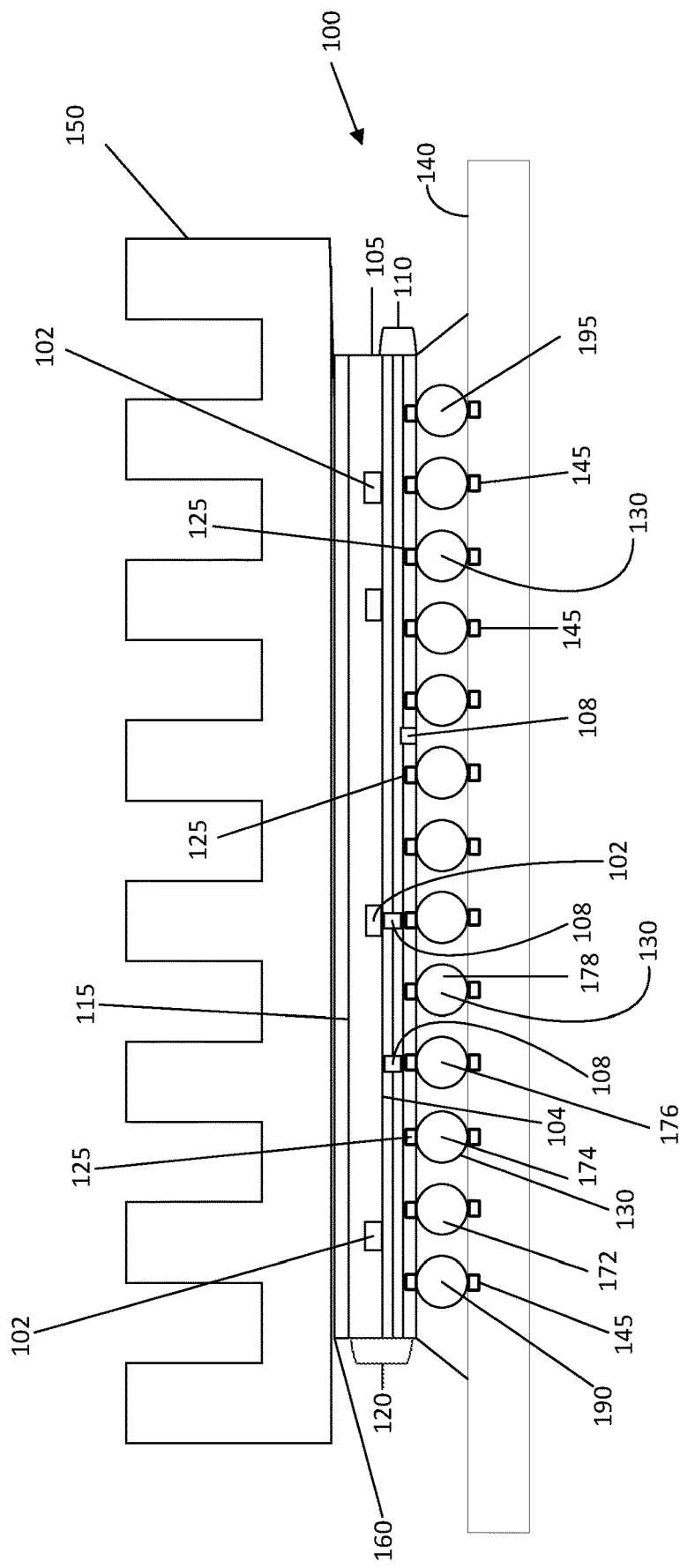
FIG. 1 depicts the cross-section of an embodiment of a VLSI silicon chip module.

Integrated circuits, including VLSI circuits, are fabricated on a thin silicon wafer, also referred to as a silicon substrate. VLSI process technology fabricates circuits on one side of the silicon substrate or wafer. As shown in FIG. 1, which is a cross-section of a silicon chip module/package 100, the transistors, diodes, resistors, capacitors and other devices, e.g., the chip devices and circuitry 102, are formed in the front or top side 104 of silicon substrate 105, and then thin metal layers or strips with insulating layers there between, referred to as metal layers 110, are formed on the front or top side 104 of the silicon substrate 105. Power and signals are delivered or routed to the circuitry (e.g., transistors, diodes, resistors, capacitors, etc.) in silicon substrate 105 through the stack of metal layers 110. Conductive via structures 108 interconnect multiple metal layers 110 to form conductive routing paths for signals and power.

Figure 2:
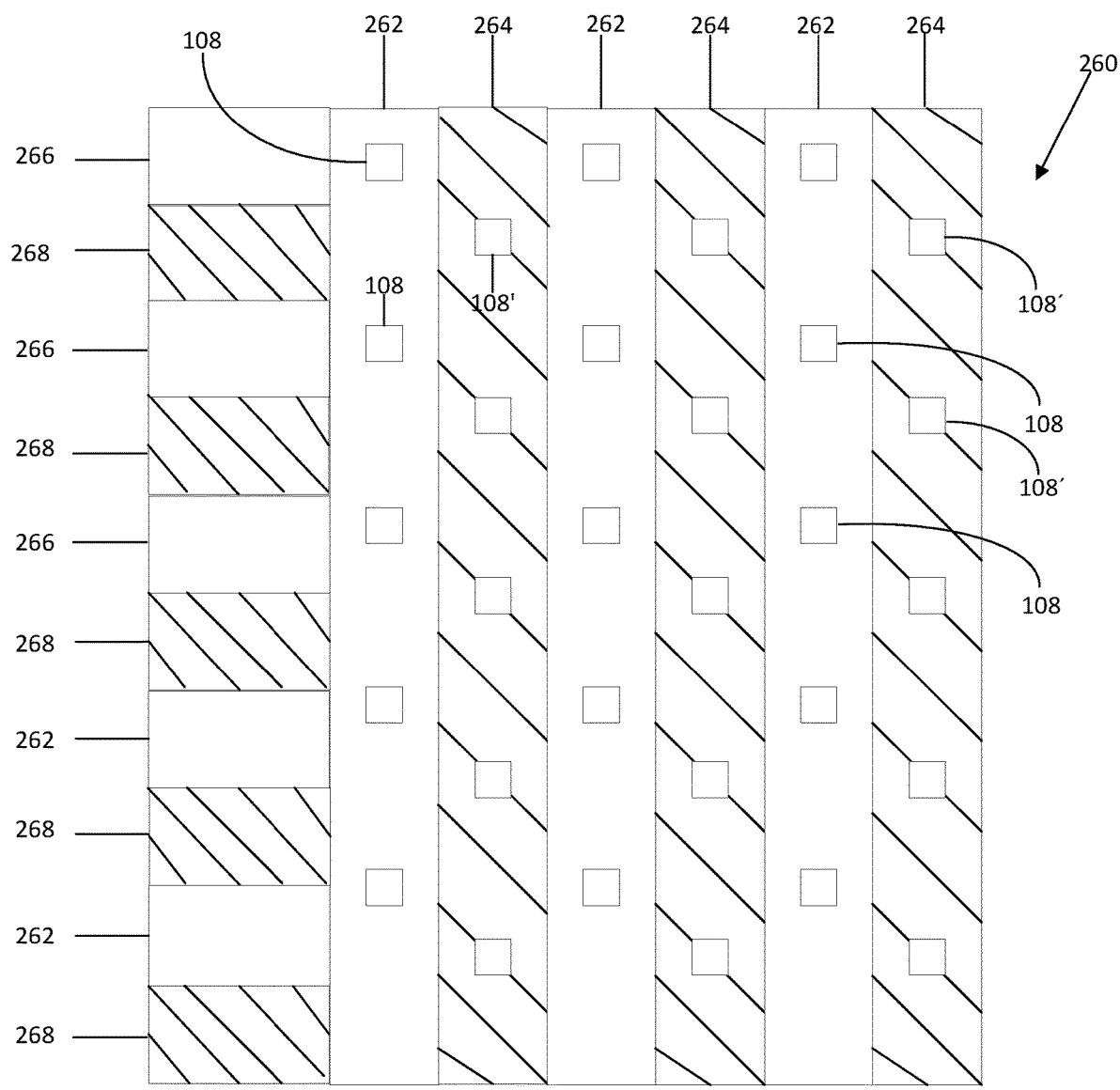
FIG. 2 depicts metal layers or planes as may be utilized in a VLSI chip.

FIG. 2 is a top view of the top metal layers or planes 110. As shown in FIG. 2, in an embodiment, metal layer or plane 110 is formed as a plurality of parallel metal strips formed into two layers with an insulator or dielectric (not shown) sandwiched between and isolating the metal layers and strips. More specifically, metal layers or planes in an embodiment include a plurality of vertically aligned alternating parallel strips 262, 264 on top that are electrically isolated from each other and a plurality of horizontally aligned alternating parallel strips 266, 268 underneath the top plane that are electrically isolated from each other and from the top layer of vertical strips 262, 264. Via structures 108 connect strips 262 and 266 to form a first conductive routing pathways, while via structures 108' connect strips 264 and 268 to form a second conductive routing pathway. Metal layers or strips 110 are connected together using a series of via structures 108 to ensure good connectivity and provide signal or power routing pathways to the silicon substrate 105. These conductive routing pathways form signal routing pathways that serve to route data signals, control signals and other signals to the circuitry in the silicon substrate. Different conductive routing pathways form conductive power routing pathways to form a power grid to provide power to the circuitry 102 in the silicon substrate 105. While FIG. 2 shows only two conductive routing pathways being utilized, it can be appreciated that more and different conductive pathways can be utilized and applied to chip 120. In addition, more or less via structures may be utilized to connect the strips forming the metal-dielectric layers or planes 110.

VLSI chip module 100 has a package substrate 140 (also referred to as a connector substrate) thorough which the signals and power are delivered to the silicon chip 120. The power and signals are delivered to the chip 120 from the package substrate 140 through an array of solder bumps or balls 130 that is sometimes referred to as a controlled collapse chip connection (C4). In particular, the chip 120 is placed upside down and an array of solder balls or bumps 130 are placed on pads 125 on the chip 120 to attach the chip 120 to respective pads 145 on the package substrate 140 to provide the various power and signal connections to the silicon chip 120.

For example, one or more different voltage levels, e.g., VDD 190 and VSS (ground) 195, are supplied to package pads 145. The power (voltage) connections 190, 195 are made from the package pads 145, through the solder balls 130, to the pad 125 in the highest level metal-dielectric strip/layer 110. The power then flows through various metal-dielectric layers 110 and via structures 108, e.g. the voltage or power conductive pathway, to the circuitry (e.g., the transistors) fabricated in the silicon substrate 105. In addition, a number of signal connections 172, 174, 176, 178 are made from the package pads 145 in the package substrate to the C4 connection bumps 130 to pads 125 on chip 120. The various signals then are routed through the metal layers 110 by via structures 108 to form signal conductive pathways to the circuitry. This method and structure leaves the bottom surface 115 (the backside) of the silicon substrate 105 completely unused and heat sinks 150 may attach (with thermal interface material (TIM) 160 in the middle) to that unused back side 115 of the silicon substrate 105 to help with heat dissipation to form a chip module 100 as shown in FIG. 1.

Some of the problems associated with the typical VLSI silicon chip design include: (a) a significant amount of metal routing resources being allocated to form the power grid, (b) significant IR (voltage) drop and power loss through the power rails formed in the metal layers and the via structures, which may also slowdown the circuit, (c) allocating a large number of controlled collapse chip connection (C4) bumps to power connections, e.g., VDD/VSS, limits the number of connections that can be used for signal connections to the package substrate, (d) variations in IR drop in different locations of the chip makes it challenging to time convergence, and (e) multiple voltage domains sharing limited C4 and wiring resources.

A new and improved method, structure, module, package, and/or architecture to supply power to integrated circuits, including VLSI silicon chips, is disclosed. In another embodiment, a new and improved method, structure, module, package, and/or architecture to provide signal connections to an integrated circuit, including VLSI silicon chips, is disclosed. In an embodiment, the new method, structure, module, package, and architecture supplies power using Through Silicon Vias (TSVs) and package wire bonds. In an aspect, the method, structure, module, package, and architecture involves using metal back planes or layers and supplying power to the silicon chip from the backside of the silicon substrate using metal back planes. The method, structure, module, package, and architecture makes more C4 connections (bumps) and more routing resources available for signal connections, enables use of wider buses for memory and peripheral connections, which may permit the buses to run slower and consume less power. The new method, structure, module, package, and architecture may permit smaller chip modules as more routing resources are available for signal routing which will allow denser placement of cells. The new method, structure, module, package, and architecture also permits power to be delivered closer to the actual silicon devices, e.g. transistors, and may lower the IR (voltage) drop in supplying power to the circuitry in the silicon substrate. The new method, structure, module, package, and architecture also does not require major modifications in package/module and heatsink design.

Figure 3:
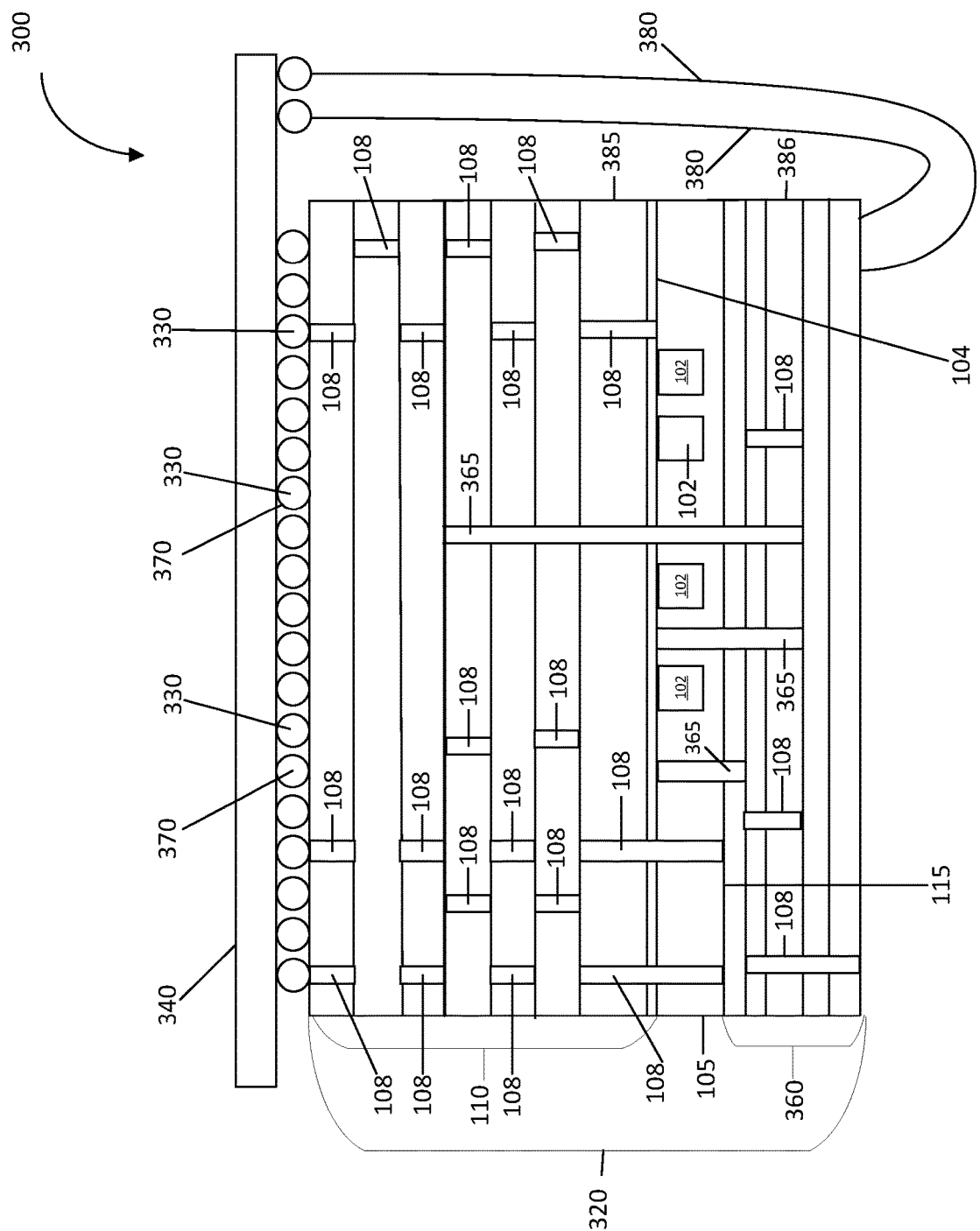
FIG. 3 depicts the cross-section of an embodiment of a VLSI chip module according to the disclosure.

FIG. 3 depicts a VLSI silicon chip module 300 having backside metal layers 360 and wire bonds 380 to supply power to the silicon chip. As shown in FIG. 3, backside metal planes 360 are formed on the bottom surface or backside 115 of the silicon substrate 105 in addition to metal layers 110 formed on the front surface or front side 104 of the silicon substrate 105. The metal layers 110 on the front side 104 of the silicon substrate 105 utilize via structures 108 to provide signal routing pathways to receive and send signals to and from the package substrate 340. In an embodiment, all the signal connections 370 to the silicon chip 220 are from the front side 104 of the silicon substrate 105. Signals 370, e.g., data and/or control signals, are sent and received through package substrate 340 to solder balls (C4 connections) 330 to the chip 320, and more specifically to metal layers 110 through via structures 108 to portions of the chip 320 and the silicon substrate 105.

Backside metal layers 360 are formed are provided on the bottom surface or backside 115 of the silicon substrate 105 and are used to form one or more voltage planes on the backside of the silicon substrate. For example, alternating metal strips and interconnecting via structures as illustrated and described with reference to FIG. 2 can be formed or provided on the backside of the silicon substrate 105 to form a power grid 386 of one or more voltages on the backside of the silicon substrate. The backside metal layers and via structures form a power or voltage routing pathway in the backside metal layers 360. One or more voltage connections are supplied to the backside metal layers 360. In the example of FIG. 3, one or more wire bonds 380 are connected to one of the back-side metal layers or strips 360 to form a VDD plane and one or more wire bonds 380 are connected to different backside metal plane or strips 360 to form a VSS or ground plane. TSVs 365 extend from the metal-dielectric layers 260 through the silicon layer 105, and in some instances to front-side metal layers 110.

In an embodiment, power or voltage pathways are also formed in the front-side metal layers 110, preferably in the one or two front-side metal layers closest to the front or top surface 104 of the silicon substrate. The one or two front-side metal layers closest to the front or top surface of the silicon substrate preferably form a power or voltage grid 385 of two or more voltage levels, e.g., VDD and ground (VSS), and may utilize vias to interconnect various strips and metal layers. The power grid 385 supplies voltage (power) to the circuitry and devices in the silicon substrate.

Figure 4:
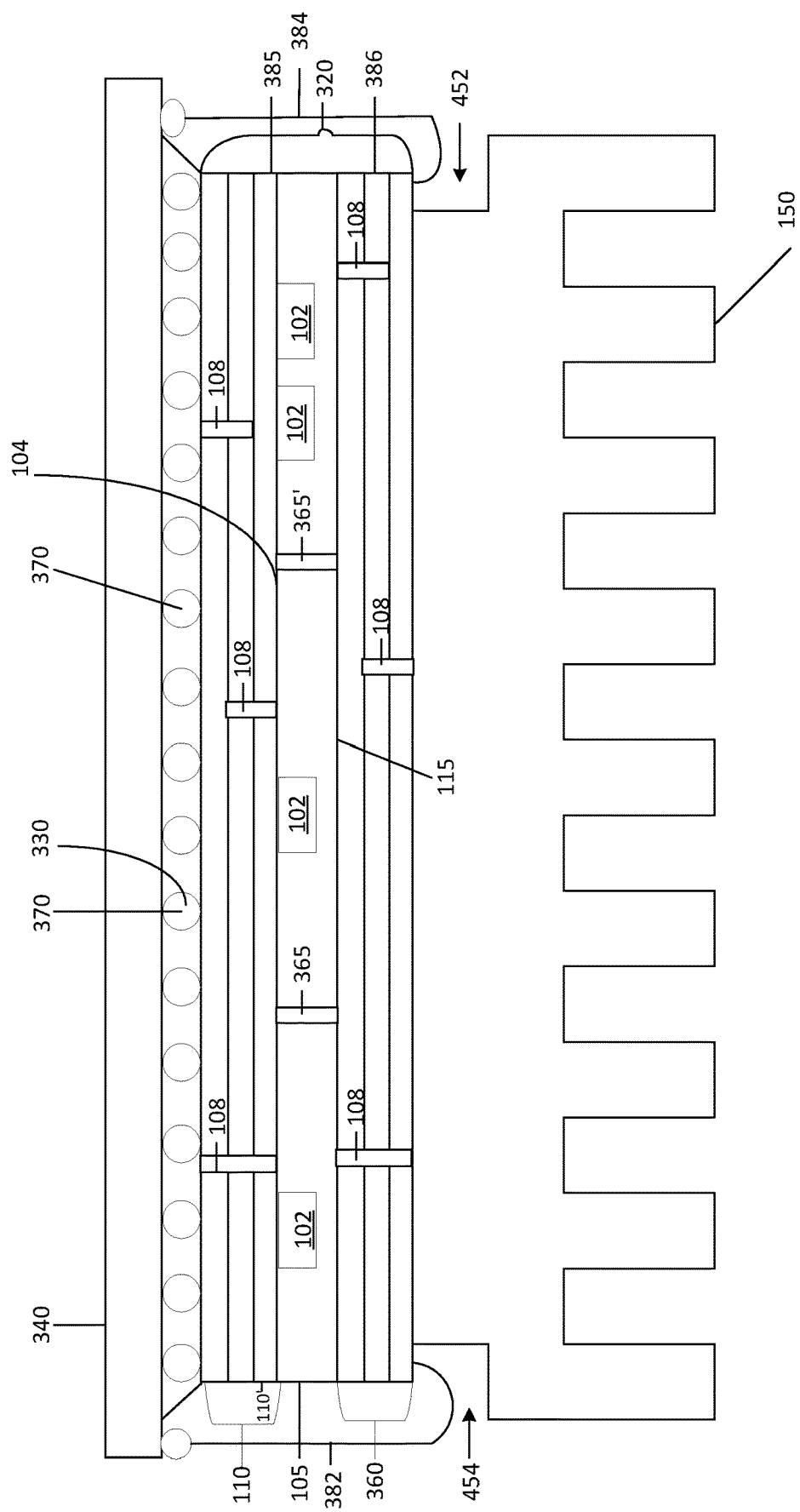
FIG. 4 depicts the cross-section of another embodiment of a VSLI chip module according to the disclosure.

FIG. 4 depicts a cross-section of an embodiment of a VLSI chip module having a package substrate 340 with C4 bumps 330 to deliver signals, e.g., data and/or control signals, to the front side 104 of the chip 320 and/or silicon substrate 105, and specifically to metal layers/strips 110. Conductive signal pathways in the front-side metal layers 110 deliver signals to the circuitry and/or to other portions of the chip 320. In an embodiment, all signal connections are delivered to the front side metal layers from the package substrate and signal routing pathways are formed in only the front side metal layers.

In the embodiment of FIG. 4, wire bonds 382, 384 are used to supply power, e.g., voltage, to the back-side metal layers/strips 360 formed on the bottom surface 115 of the silicon substrate 105. The metal layers preferably are provided with conductive power routing pathways to distribute the different voltages in the backside metal layers and to form a power/voltage grid 386. Via structures as illustrated in FIG. 2 may be used to form the conductive power routing pathway and/or power grid 386. TSVs 365 are used to tunnel through silicon substrate 105 and to supply a conductive routing pathway to the front side layers/strips 110, and preferably to the one or more front-side metal layers/strips 110' closest to the front/top side 104 of the silicon substrate, preferably to the front side metal layer 110' closest to the silicon substrate, to supply power (voltage) to the front-side layers 110. A power (voltage) grid 385 may be formed in the front layers 110, preferably in an embodiment using via structures 108, to distribute power through the front layers 110. While two voltage levels have been described in connection with the various embodiments it can be appreciated that more and different voltages may be supplied to the backside metal layer using the structures and techniques described.

FIG. 4 shows a VLSI chip with power (voltage) supplied to backside metal layers of the VLSI chip. In an embodiment, there may be more front side metal layers 110 then back side metal layers 360, although designs may have less front side metal layers 110 than back side metal layers 360, or the same number of metal layers in the front-side and the back-side. In an embodiment, spacing is provided to create a wire bond contact point/pad with the one or more backside metal layers. In an embodiment, one or more notches 454, 456 may be formed in the heat sink 150 to permit wire bonds 382, 384 to connect to metal strip layers 320. In the design of FIGS. 3 and 4, there is more area for signal connection pads on the front side of the silicon chip/module as power is supplied to the back side layers of the silicon chip/module.

An integrated circuit module is disclosed that in an embodiment includes: a silicon chip having a silicon substrate having circuitry formed therein, the silicon substrate having a top surface and a bottom surface; one or more front-side metal layers formed on the top surface of the silicon substrate; one or more back-side metal layers formed on the bottom surface; and one or more through silicon vias (TSVs) formed through the silicon substrate for creating a conductive pathway from the back-side of the silicon substrate to the front-side of the silicon substrate. The integrated circuit module further includes a package substrate having voltage connections and signal connections, where the module is configured so that a plurality of signal routing pathways are formed from the signal connections on the package substrate through a plurality of C4 connections to one or more of the front-side metal layers to the circuitry in the silicon substrate, and a plurality of voltage routing pathways are formed from the voltage connections on the package substrate to the one or more back-side metal layers to the one or more TSVs to one or more of the front-side metal layers to the circuitry in the silicon substrate.

In the integrated circuit module, preferably one or more TSVs are configured to extend through the silicon substrate to the front-side metal layer closest to the top surface of the silicon substrate, and the voltage routing pathways extend to the front-side metal layer closest to the top surface of the silicon substrate. The voltage routing pathways in an embodiment are configured and routed from the voltage connections on the package substrate through wire bonds to the one or more back-side metal layers. In an aspect, all voltage connections on the package substrate are configured and routed from the package substrate to the back-side metal layers. In a further aspect, all the voltage connections on the package substrate are configured and routed from the package substrate through wire bonds to the one or more backside metal-dielectric strip layers.

In an embodiment, all the signal connections on the package substrate are configured and routed from the package substrate through C4 connections to the one or more front-side metal layers. The integrated circuit module may further include a heat sink attached to the silicon chip closer to the bottom surface of the silicon substrate than to the top surface of the silicon substrate. Notches may be provided in the heat sink to facilitate connecting one or more wire bonds to the one or more backside metal layers. The integrated circuit module in an aspect is configured to receive at least two voltage levels comprising VDD and ground. The voltage levels in an embodiment are supplied to the one or more backside metal layers and voltage power grid is provided in the top-side metal layer closest to the silicon substrate.

Figure 5:
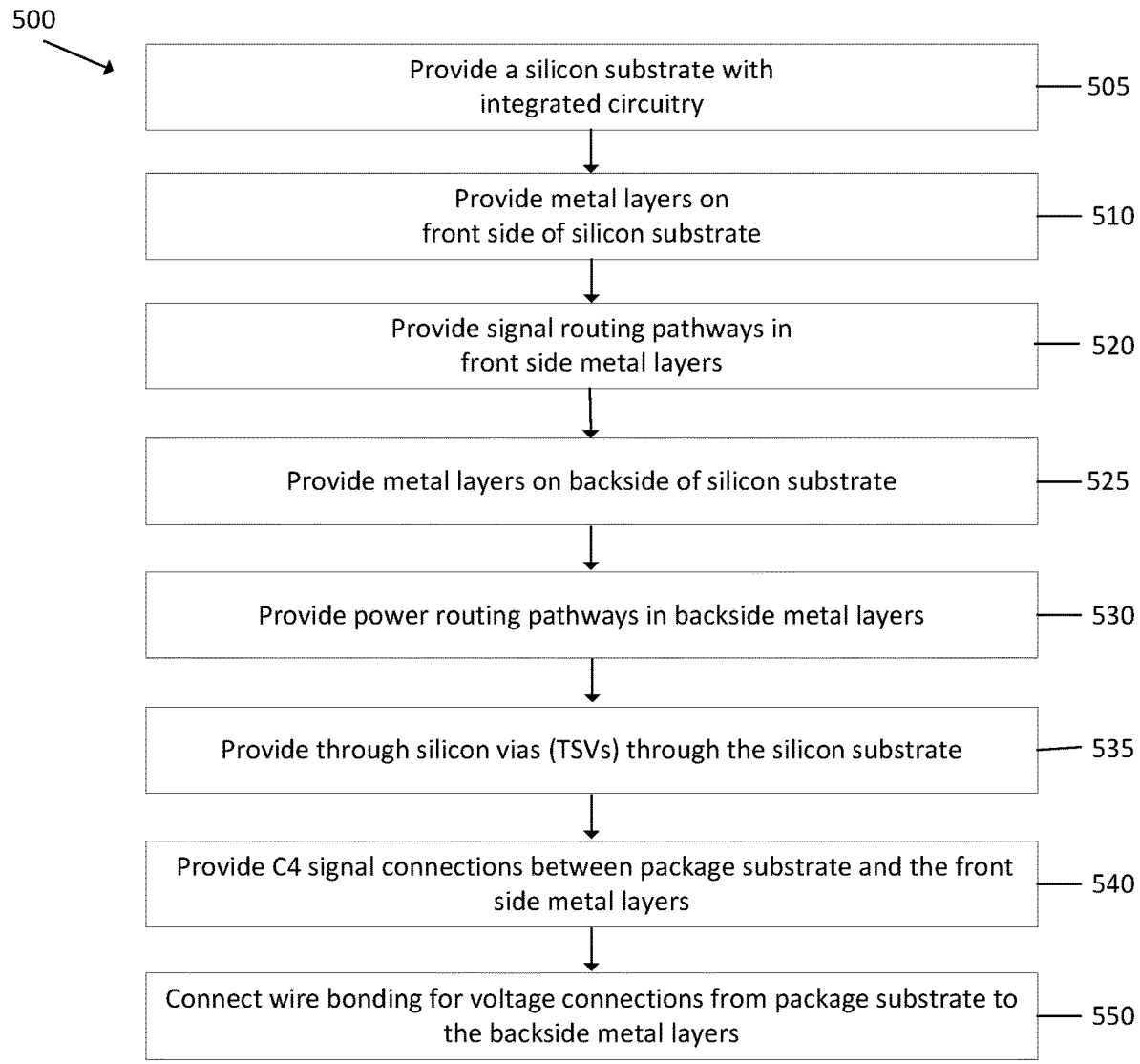
FIG. 5 depicts an embodiment of a method of configuring the signal and voltage connection and routing pathways for a VLSI chip module.

FIG. 5 is an exemplary flowchart in accordance with one embodiment illustrating and describing a method of powering and providing signals to an integrated circuit, including a method of powering an integrated circuit, preferably a VSLI chip. While the method 500 is described for the sake of convenience and not with an intent of limiting the disclosure as comprising a series and/or a number of steps, it is to be understood that the process does not need to be performed as a series of steps and/or the steps do not need to be performed in the order shown and described with respect to FIG. 5, but the process may be integrated and/or one or more steps may be performed together, simultaneously, or the steps may be performed in the order disclosed or in an alternate order.

The method 500 of providing signal and power connections to a chip and/or chip module includes at 505 providing a silicon substrate with integrated circuitry, e.g., transistors, diodes, resistors, capacitors, etc. Metal layers may be provided and/or formed at 510 on a front side of the silicon substrate. That is, one or more metal layers may be formed on the top surface (e.g., front side) of the silicon substrate. In an aspect, the silicon substrate may be provided with integrated circuitry formed in the silicon substrate and with metal layers provided on a front/top side of the silicon substrate. In an example, the metal layers may be formed as alternating strips electrically isolated from each other as described in connection with FIG. 2, although other structures and techniques for forming metal layers are contemplated. In an embodiment, signal routing pathways, e.g., pathways for data and control signals, are provided or formed in the front side metal layers at 520. In an aspect, one or more, and preferably a plurality of, via structures may be formed in the front side metal layers to form in combination with the metal layers one or more signal pathways.

In an embodiment, additional metal layers at 525 are formed or provided on the backside of the silicon substrate. That is, in an embodiment one or more metal layers may be formed on the bottom surface (e.g., back side) of the silicon substrate. In an aspect, one or more conductive power (voltage) routing pathways at 530 are provided or formed in the backside metal layers to create, in an embodiment, a power grid. In an example, via structures may be utilized and the strip layer structure and techniques of FIG. 2 may be utilized to form the conductive power (voltage) routing pathways. Other structures and techniques are contemplated for forming the conductive power (voltage) routing pathways in the backside metal layers. In an embodiment, an integrated circuit or silicon chip is provided or created that includes in an aspect, circuitry in a silicon substrate, one or more metal layers formed or provided on a front side of the silicon substrate for providing one or more signal connections to the circuitry, and one or more metal layers provided or formed on the backside of the silicon substrate for providing voltage and/or power to the circuitry.

Through silicon vias (TSVs) are provided or formed at 535 through the silicon substrate. In an embodiment, the TSVs are formed from the backside metal layer closest to the silicon substrate through the silicon substrate to the front side metal layer closet to the silicon substrate. The TSVs in embodiments, optionally extends to other front side metal layers. The TSVs supply power from the backside of the silicon substrate to the front side of the silicon substrate, and in an aspect creates a power grid in the front side metal layer closest to the silicon substrate.

In an aspect, a chip is provided or formed having circuitry in a silicon substrate, top side metal layers forming signal pathways to the circuitry, backside metal layers forming a power routing pathway to the backside of the silicon substrate, and TSVs through the silicon substrate to provide power to one or more front side metal layers, preferably, to the front side metal layer closest to the silicon substrate to supply power to the front side of the silicon substrate, and preferably to form a power grid on the front side of the silicon substrate.

In an embodiment, at 540, C4 signal connections are provided between a package substrate and the front side metal layers, where, in an aspect, the package substrate and C4 signal connections are configured and adapted for signal, e.g., data and control signals, and are not configured for power connections. In an embodiment, all signal connections from the package substrate are supplied to the front side metal layers, in an aspect using only C4 bump connections. At 550, the package substrate is configured and adapted to provide power connections to the chips via wire bonding, and in an aspect, wire bonding for voltage connections connect power connections on the package substrate to backside metal layers. In an embodiment, wire bondings connect power connections, e.g., one or more voltage levels, from the package substrate to the backside strip layers.

Figure 6:
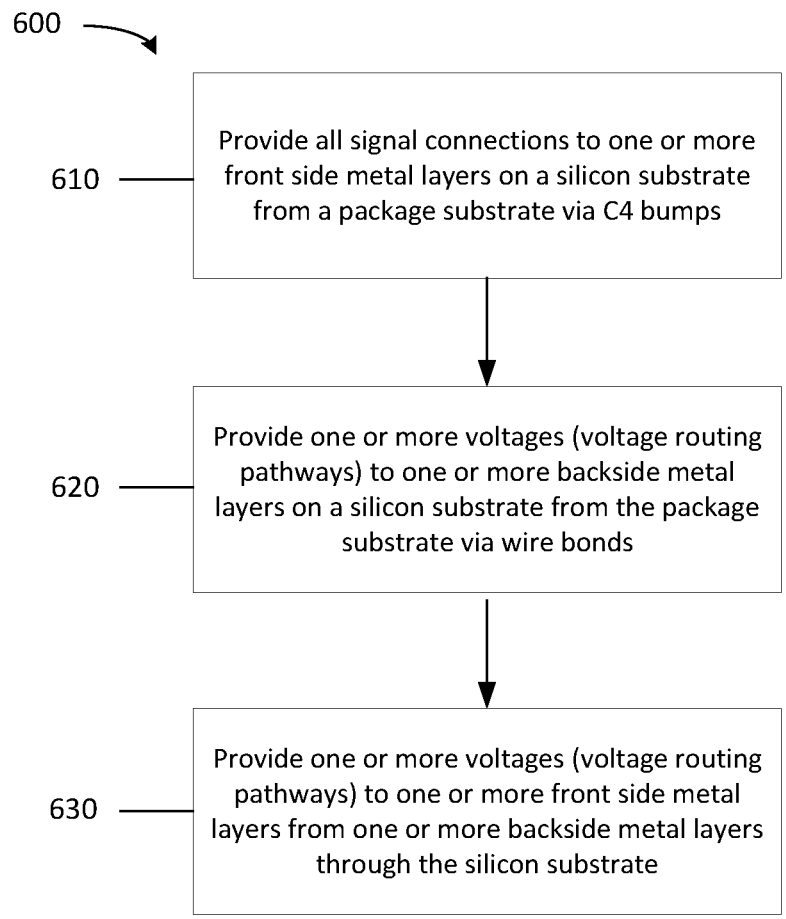
FIG. 6 depicts an embodiment of a method of powering and providing signal connections in a VLSI chip module.

FIG. 6 provides a flow chart of a method 600 of providing signal connections and power voltage connections to a silicon chip and in an aspect, of providing power and signals to a chip. Flow chart 600 can also be considered a method of forming or creating an integrated circuit or chip module. At 610, in an embodiment, one or more signal connections, and in an aspect, preferably all signal connections, and in a further aspect, none of the power connections, are supplied and/or provided to one or more metal layers on a silicon substrate, preferably to one or more front side metal layers. In a further embodiment, at 610, the signal connections, preferably all of the signal connections are supplied and/or provided to the front side metal layers from a package substrate by C4 bump connections.

In a further aspect, at 620, one or more voltages, e.g., power, is supplied or provided to one or more backside metal layers on a silicon substrate. In an aspect, voltages may include one or more voltage levels, including for example VDD, VSS (ground) or other voltage levels. In a further aspect, at 620, all the different voltage levels, e.g., power, is supplied or provided from the package substrate to the back side metal layers of the chip. In a preferably aspect, the power and/or voltages, and in an aspect all the voltage domains, are supplied or provided to the backside metal from the package substrate by wire bonds. In an aspect, a power grid is formed by and in the backside metal layers.

In an embodiment, at 630, one or more voltages, e.g., power, are supplied or provided from the backside metal layers and/or power grid to one or more front-side metal layers, and in an aspect to only the front-side metal layers closest to the silicon substrate, and preferably to the front-side metal layer closest to the silicon substrate. In an aspect, at 630, one or more voltages are supplied or provided from the backside metal layers to the front-side metal layers through the silicon substrate, preferably using one or more TSVs. In an embodiment, power (e.g., one or more voltages, are supplied or provided from the backside metal layers to one or more of the front-side metal layers closest to the silicon substrate, preferably the front-side metal layer closest to the silicon substrate, preferably using one or more TSVs.

A method of providing power and signals to an integrated circuit is disclosed where the method includes providing one or more signals to one or more front-side metal layers formed on a top surface of a silicon substrate, providing one or more voltages to one or more back-side metal layers formed on a bottom surface of a silicon substrate, and providing one or more voltages to the one or more front-side metal layers from the one or more backside metal layers through the silicon substrate. In an embodiment, all the signals are provided to the one or more front side metal layers, and in an aspect all the signals are provided to the one or more front-side metal layers through C4 connections. In a further aspect of the method, all voltages are supplied to the one or more back-side metal layers, and in an embodiment are thereafter routed to the front-side metal layer closest to the silicon substrate. The voltages in an embodiment are supplied to the one or more backside metal layers using wire bonds and the voltages are supplied from the back-side metal layers through the silicon substrate to the one or more front-side metal layers using one or more TSVs.

In a further aspect of the disclosure, a method of forming an integrated circuit module is described that includes forming circuitry in a silicon substrate, forming one or more front-side metal layers on a top surface of the silicon substrate including forming one or more front-side conductive signal pathways to route signals to the circuitry, forming one or more back-side metal layers on a bottom surface of the silicon substrate including forming one or more back-side conductive power pathways to route voltages to the back-side of the silicon substrate, forming one or more front-side conductive power pathways in the one or more front-side metal layers to route power to the circuitry, and providing one or more through silicon vias (TSVs) to route the one or more backside conductive power pathways through the silicon substrate to the one or more front-side conductive power pathways. In an aspect, at least one of the TSVs extends from the backside metal layers though the silicon substrate to only the top-side metal layer closest to the silicon substrate. In an embodiment, all the one or more back-side conductive power pathways are wire bonded to a package substrate, and C4 connections are formed between the package substrate and one or more of the front-side conductive signal pathways. In a further aspect, all the conductive signal pathways are formed in the front-side metal strip layers and no conductive signal pathways are formed in the back-side metal layers, and voltage planes are formed in the one or more top-side metal layers closest to the silicon substrate.

Aspects of the present invention are described herein with reference to flowchart illustrations and/or block diagrams of methods, and apparatus (systems). It will be understood that each block of the flowchart illustrations and/or block diagrams, and combinations of blocks in the flowchart illustrations and/or block diagrams, can be implemented by circulating, semiconductor processing, structures and/or techniques. The flowchart and block diagrams in the figures illustrate the architecture, functionality, and operation of possible implementations of systems, and methods, according to various embodiments of the present invention. In this regard, each block in the flowchart or block diagrams may represent a module, segment, circulating, or portions of integrated circuits, silicon chips and semi-conductors instructions for implementing the specified function(s). In some alternative implementations, the functions noted in the block may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by other structures that perform the specified functions or acts. It will be clear that the various features of the foregoing systems and/or methodologies may be combined in any way, creating a plurality of combinations from the descriptions presented above.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit module comprising:
    a silicon chip comprising:
        a silicon substrate having a top surface, a bottom surface, and circuitry formed in the top surface including one or more transistors;
        one or more front-side metal layers formed on the top surface of the silicon substrate;
        one or more back-side metal layers formed on the bottom surface; and
        one or more through silicon vias (TSVs) formed through the silicon substrate for creating a conductive pathway from the back-side of the silicon substrate to the front-side of the silicon substrate; and
    a package substrate having voltage connections and signal connections, wherein, the module is configured so that:
        a plurality of signal routing pathways are formed from the signal connections on the package substrate through a plurality of C4 connections to one or more of the front-side metal layers formed on the top surface of the silicon substrate to the circuitry in the silicon substrate, and
        a plurality of voltage routing pathways are formed from the voltage connections on the package substrate to the one or more back-side metal layers formed on the bottom surface of the silicon substrate to the one or more TSVs to one or more of the front-side metal layers to the circuitry in the silicon substrate.

2. The integrated circuit module of claim 1, wherein the one or more TSVs are configured to extend through the silicon substrate to the front-side metal layer closest to the top surface of the silicon substrate, and the voltage routing pathways extend to the front-side metal layer closest to the top surface of the silicon substrate.

3. The integrated circuit module of claim 1, wherein the voltage routing pathways are configured and routed from the voltage connections on the package substrate through wire bonds to the one or more back-side metal layers.

4. The integrated circuit module of claim 1, wherein all voltage connections on the package substrate are configured and routed from the package substrate to the back-side metal layers.

5. The integrated circuit of claim 4, wherein all the voltage connections on the package substrate are configured and routed from the package substrate through wire bonds to the one or more backside metal layers.

6. The integrated circuit module of claim 4, wherein all the signal connections on the package substrate are configured and routed from the package substrate through C4 connections to the one or more front-side metal layers.

7. The integrated circuit module of claim 1, further comprising a heat sink attached to the silicon chip closer to the bottom surface of the silicon substrate than to the top surface of the silicon substrate.

8. The integrated circuit module of claim 7, further comprising notches in the heat sink to facilitate connecting one or more wire bonds to the one or more backside metal layers.

9. The integrated circuit module of claim 1, wherein the module is configured to receive at least two voltage levels comprising VDD and ground.

10. The integrated circuit module of claim 9, wherein the voltage levels are supplied to the one or more backside metal layers and voltage power grid is provided in a front-side metal layer closest to the silicon substrate.

* * * * *